US010522965B2

(12) United States Patent
Suelzer et al.

(10) Patent No.: US 10,522,965 B2
(45) Date of Patent: Dec. 31, 2019

(54) TUNABLE MICROWAVE SIGNALS BASED ON INJECTION-LOCKED LASERS WITH FEEDBACK

(71) Applicant: Government of the United States, as represented by the Secretary of the Air Force, Wright-Patterson AFB, OH (US)

(72) Inventors: Joseph S. Suelzer, Dayton, OH (US); Nicholas G. Usechak, Oakwood, OH (US); Preetpaul S. Devgan, Oakwood, OH (US); Thomas B. Simpson, San Diego, CA (US)

( * ) Notice: Subject to any disclaimer, the term of this patent is extended or adjusted under 35 U.S.C. 154(b) by 0 days.

(21) Appl. No.: 16/059,400

(22) Filed: Aug. 9, 2018

(65) Prior Publication Data

US 2019/0312404 A1 Oct. 10, 2019

Related U.S. Application Data

(60) Provisional application No. 62/652,962, filed on Apr. 5, 2018.

(51) Int. Cl.
*H01S 3/10* (2006.01)
*H01S 3/13* (2006.01)
*H01S 3/00* (2006.01)

(52) U.S. Cl.
CPC ......... *H01S 3/10092* (2013.01); *H01S 3/005* (2013.01); *H01S 3/1305* (2013.01)

(58) Field of Classification Search
CPC ..... H01S 3/10092; H01S 3/005; H01S 3/1305
See application file for complete search history.

(56) References Cited

U.S. PATENT DOCUMENTS

2003/0197917 A1* 10/2003 Yap ................. G02F 2/002
359/330
2009/0245306 A1* 10/2009 Rakuljic .............. H01S 5/0687
372/29.011

* cited by examiner

*Primary Examiner* — Xinning(Tom) Niu
(74) *Attorney, Agent, or Firm* — AFMCLO/JAZ

(57) ABSTRACT

A system and method for generating optically synthesized microwave signals with broadband tunability is disclosed. The system includes a first laser and a second laser, where the first laser and second laser are optically coupled to each other. The second laser is operable to receive optical signals injected by the first laser, and to output optical signals via one or more feedback paths. The system provides for singular or mutual optical injection. A photodetector is optically coupled to the second laser over the one or more feedback paths, and operable to convert optical signals to electrical signals. A phase modulator is coupled to the photodetector, where the electrical signals from the photodetector are operable to drive the phase modulator and close the one or more feedback paths. The respective lengths of the feedback paths may be selected such that their corresponding lengths provide a frequency spacing for optical signals therein that is significantly smaller than a frequency of microwave signals.

23 Claims, 7 Drawing Sheets

TUNABLE MICROWAVE SIGNALS BASED ON INJECTION-LOCKED LASERS WITH FEEDBACK

CROSS-REFERENCE TO RELATED APPLICATION(S)

The present application claims the benefit of U.S. Provisional Application No. 62/652,962, filed Apr. 5, 2018, the contents of which are hereby incorporated by reference.

STATEMENT OF GOVERNMENT INTEREST

The invention described herein may be manufactured, used, and licensed by or for the Government of the United States for all governmental purposes without the payment of any royalty.

BACKGROUND

It is advantageous to generate and detect microwave signals with frequencies as large as 110 GHz. This need is perpetuated by increasing traffic being carried at lower frequencies (i.e., <40 GHz), and advances in photonic and electronic technologies that provide for the generation of stable millimeter waves. A widely used component in radio frequency (RF) and microwave systems is the voltage-controlled oscillator (VCO). The ability to tune the frequency via a DC voltage is a key feature of VCOs. While VCOs may be deployed in the microwave and millimeter regime, there is a trade-off between wideband tunability and low phase noise of generated microwave signals. For example, a typical VCO having a 1.2 GHz bandwidth exhibits a phase noise of −108 dBc/Hz at a 10 kHz offset for a carrier frequency of 2.5 GHz. As a comparison, a wideband (20 GHz) VCO exhibits a phase noise of −82.76 dBc/Hz at a 50 kHz offset for a carrier frequency of 40 GHz. These characteristics highlight this fundamental trade-off between tunability and phase noise.

The ability to optically synthesize microwave signals (OSMS) is an attractive method because of the very large carrier frequencies involved, e.g. 192 THz for Datacom wavelength (1550 nm) lasers. One known expedient to OSMS is to heterodyne a pair of tunable lasers. However, because of the convolution of the corresponding optical fields at a photodetector, the greater deleterious phase noise of the two lasers will be transferred to the microwave signal. In order to reduce the undesirable effects of such phase noise, a known method is to phase lock the lasers, for example, by using an optical phase-locked loop (OPPL). Although this approach is successful in reducing the phase noise, it restricts the tuning bandwidth and tuning speed, both of which depend on the OPPL bandwidth Other known systems for generating stable, low phase-noise microwave signals, use an optoelectronic oscillator (OEO). The topology of the OEO includes a continuous-wave (CW) laser, which is injected into an optoelectronic loop comprising an electro-optic (EO) modulator, and a long fiber delay, a photo-diode, an electronic amplifier and a filter. Due to the gain in the OEO loop, any inherent noise undergoes an amplification and, given the appropriate operating parameters, sustains stable oscillations. In the absence of an electronic filter, this system is typically "multimode," with a frequency spacing between the modes determined by the length of the OEO loop. In addition, the long fiber delay provides a Q of sufficient magnitude necessary to reduce the linewidth of the microwave signal. OEO topologies have undergone significant improvements, such as the use of dual cavity configurations and accompanying dramatic reductions in size. The size reduction is achieved by replacing the long fiber delays with micro-cavities having extremely large Q factors, e.g. a whispering-gallery-mode (WGM) oscillator, micro-ring resonator, etc. Another modification of this system reduces the number of components by replacing the EO modulator and CW laser source with a single semiconductor laser (SCL). Recently, an optical injection OEO scheme has been implemented having a slave laser that functions as an electronic filter. However, such a design necessitates the use of an electronic amplifier, and long-term stability has not been addressed.

In view of the above, it would be advantageous to provide a system and methodology for generating optically synthesized microwave signals with broadband tunability having superior performance and low phase noise.

BRIEF DESCRIPTION OF THE DRAWINGS

The accompanying drawings provide visual representations which will be used to more fully describe various representative embodiments and can be used by those skilled in the art to better understand the representative embodiments disclosed and their inherent advantages. The drawings are not necessarily to scale, emphasis instead being placed upon illustrating the principles of the devices, systems, and methods described herein. In these drawings, like reference numerals may identify corresponding elements.

DETAILED DESCRIPTION

Figure 1:
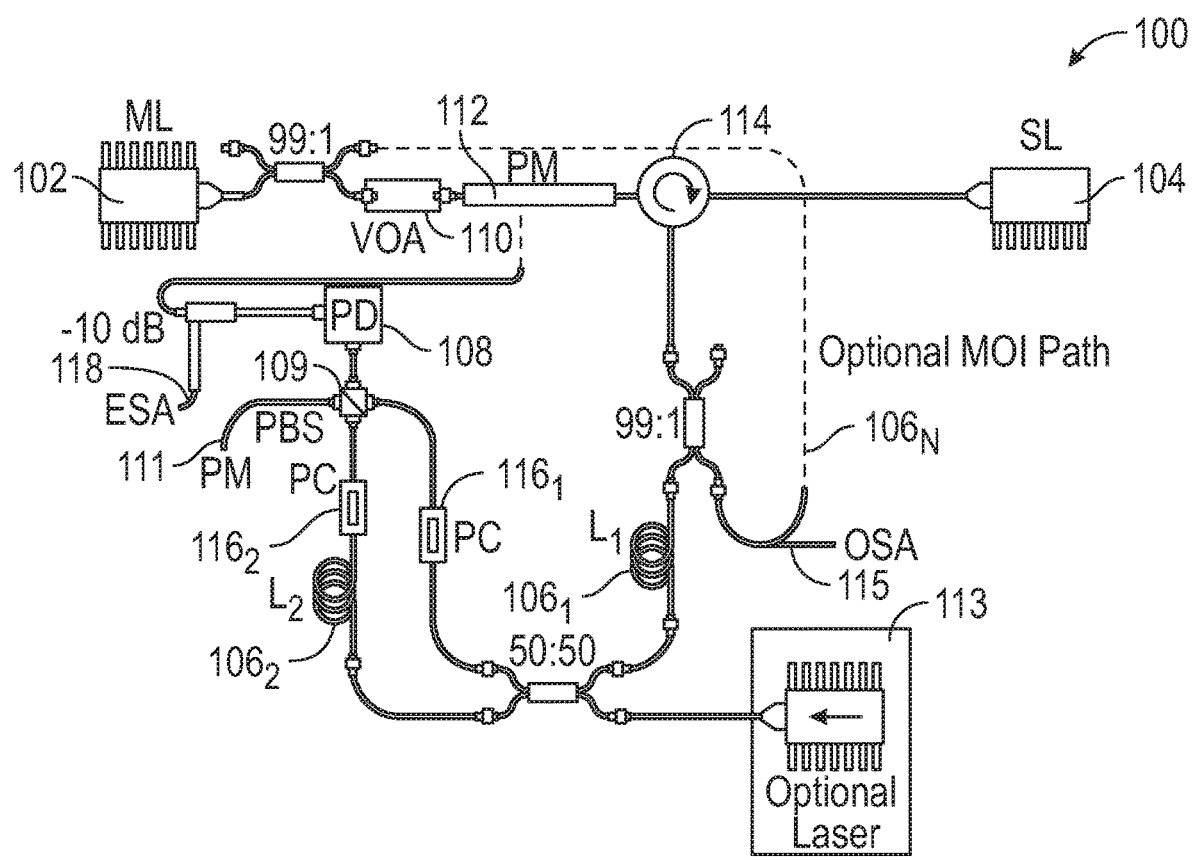
FIG. 1 is a high-level schematic diagram of a system for generating optically synthesized microwave signals with broadband tunability in accordance with embodiments of the disclosure.

Specific embodiments of the disclosure will now be described in detail with reference to the accompanying figures. While this disclosure is susceptible of being embodied in many different forms, there is shown in the drawings and will herein be described in detail specific embodiments, with the understanding that the present disclosure is to be considered as an example of the principles of the disclosure and not intended to limit the disclosure to the specific embodiments shown and described. In the description below, like reference numerals may be used to describe the same, similar or corresponding parts in the several views of the drawings.

All documents mentioned herein are hereby incorporated by reference in their entirety. References to items in the singular should be understood to include items in the plural, and vice versa, unless explicitly stated otherwise or clear from the text.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

A system and method for generating optically synthesized microwave signals with broadband tunability is provided in accordance with embodiments of the disclosure. The system generally constitutes an optically injected semiconductor laser (SCL) subject to optoelectronic feedback (OEFB), and an optional path that provides mutual optical injection (MOI). The injected light from a first laser (e.g., master laser) perturbs both the optical field and charge carriers inside a second laser (e.g., slave laser), thereby causing a rich variety of dynamical behavior. The operating parameters are selected to produce stable periodic oscillations with frequencies that lie in the microwave and RF domains. Advantageously, the power of the induced microwave signals is dependent upon both the bias conditions of the second laser, and the optical injection parameters. In this regard, the amplitude of the microwave signal used for OEFB is a significant factor in the ability to reduce the phase noise.

This disclosure exploits the operating points at which the microwave power is greatest, which, in general, occurs near the Hopf bifurcation as will be appreciated by those skilled in the art. Thus, the requirement for microwave amplifiers or filters within the feedback loop is eliminated, nor is there a need to rely on external signal generators to derive the microwave signals phase stability. This feature enables broadband tuning from 10 GHz to 110 GHz, which would otherwise be restricted by such electronic amplifiers and/or filters. Further, the use of asymmetric MOI increases long-term stability of the system. Overall, embodiments in accordance with this disclosure provide for the generation millimeter-wave signals (out to 110 GHz) with Hz-level linewidth, while maintaining broadband tunability without the need to swap system components.

In view of the above and in accordance with an embodiment of the disclosure, there is provided a system for generating optically synthesized microwave signals with broadband tunability. The system includes a first laser (e.g., master laser) and a second laser (e.g., slave laser) optically coupled to the first laser. The second laser is configured to receive optical signals injected by the first laser, and operable to output optical signals via one or more feedback paths. A photodetector (an alternative configuration can employ a balanced detector) converts the optical signals from the second laser to electrical signals. A phase modulator is coupled to the photodetector, and the electrical signals from the photodetector are operable to drive the phase modulator and close the one or more feedback paths. The system is operable to output at least one of electrical signals and optical signals.

In accordance with a further embodiment of the disclosure, the one or more feedback paths include a first feedback path and a second feedback path, where the first path has a first corresponding length and the second path having a second corresponding length, such that a frequency spacing of the feedback paths is significantly smaller than a frequency of microwave signals.

In accordance with yet another embodiment of the disclosure, the system, further includes one or more polarization controllers to orthogonally polarize optical fields for corresponding optical signals in the first and second paths.

In accordance with still another embodiment of the disclosure, the first laser and the second laser are mutually coupled to provide MOI.

In accordance with yet another embodiment of the disclosure, the system further includes a variable optical attenuator optically coupled to the first laser, a phase modulator optically coupled to the variable optical attenuator, and a circulator optically coupled to the variable optical attenuator and configured to inject phase modulated optical signals into the second laser and to output optical signals into the one or more feedback paths.

In accordance with still another embodiment of the disclosure, a mutual optical injection (MOI) path is coupled to the variable optical attenuator.

In accordance with yet another embodiment of the disclosure, there is provided at least one polarizing beam splitter.

In accordance with an exemplary embodiment of the disclosure, the second laser is biased at multiples of a threshold current, and a detuning frequency is controlled by adjusting a temperature of the slave laser.

In accordance with another exemplary embodiment of the disclosure, an injection strength is controlled by a variable optical attenuator.

In accordance with another embodiment of the disclosure, there is provided a method for generating optically synthesized microwave signals with broadband tunability. The method includes generating light by a first laser; receiving light at a second laser optically coupled to the first laser and configured to receive optical signals injected from the first laser, the second laser operable to output optical signals via one or more feedback paths; converting optical signals to electrical signals by a photodetector optically coupled to the second laser over the one or more feedback paths; and driving a phase modulator coupled to the photodetector with electrical signals from the photodetector to close the one or more feedback paths.

FIG. 1 is a high-level schematic diagram of a system 100 for generating optically synthesized microwave signals with broadband tunability. The system 100 includes a first laser (e.g., master laser (ML)) 102 and a second laser (e.g., slave laser (SL)) 104 optically coupled to the first laser. The SL 104 is configured to receive optical signals injected by the ML 102, and operable to output optical signals via one or more feedback paths 106$_1$, 106$_2$, ... 106$_N$. A photodetector (i.e., photodiode or balanced photodiode (PD)) 108 is optically coupled to the SL 104 over the one or more feedback paths 106$_1$, 106$_2$, and is operable to convert optical signals to electrical signals (in the microwave frequency domain).

Intensity oscillations, having frequencies that reside in the RF and microwave domains, are induced by optically injecting coherent light from the lasers 102, 104. The injected light from the ML 102 perturbs both the optical field and the charge carriers inside the SL laser 104, thereby causing a rich variety of dynamical behavior. The dynamics are converted into microwave signals by the PD 108. Advantageously, the frequency of the microwave signal is tuned by adjusting the injection strength and/or the detuning the $\Delta f$. In accordance with embodiments of the disclosure, such detuning is defined as the difference between the optical emission frequencies of the ML and free-running SL ($\Delta f = f_{ML} - f_{SL}$). The change in the detuning and injection strength drives the dynamical response of an optically injected SCL.

With further reference to FIG. 1, the injection strength is controlled independent of the wavelength by a variable optical attenuator (VOA) 110. The attenuated light is directed through an electro-optic (EO) phase modulator (PM) 112 and, subsequently, injected (via a circulator 114) into the SL 104. The output of the SL 104 is split into two paths 106₁, 106₂. In the depicted embodiment, the first path 106₁ is coupled to an optical polarization beam splitter (PBS) 109 and the PD 108. The two paths (106₁ and 106₂) are recombined at the PBS 109, and the light from the re-combined paths is directed to the PD 108 to provide optoelectronic feedback. The two feedback paths of unequal length produce the Venier effect, which effectively suppresses non-oscillating side-modes. It will further be appreciated that the length of the feedback path directly affects the quality of phase noise, i.e., long paths reduce the phase noise. In an exemplary application, the feedback passes through a first fiber of length $L_1=10$ km and is split into two loops, where one loop is composed of a second fiber of length $L_2=100$ m. Thus, the total lengths of the dual feedback paths are approximately 10 km and 10.1 km, respectively. In the exemplary expedient, the frequency spacing $f_{ECM}$ is approximately 20 kHz. An optical spectrum analyzer (OSA) 115 is utilized for monitoring purposes. A power meter (PM) 111 is operably coupled to PBS 109.

The frequency spacing of $f_{ECM}$ of the feedback paths is significantly smaller than the microwave frequencies and appear as electronic spurs in phase-noise measurements at integer multiples of this frequency. A polarization controller (PC) 116₁, 116₂ in a corresponding loop 106₁, 106₂, is configured and respectfully aligned such that the polarization of the corresponding optical fields for the optical signals in each loop are orthogonal and come from interferometric arms with unequal lengths when detected by the PD 108. This characteristic advantageously suppresses unwanted spurious side-modes in the microwave spectra. A small portion (−10 dB) of the electronic signal may be communicated to an electrical spectrum analyzer (ESA) 118 for monitoring, while the remaining signal is used to drive a phase modulator (PM) 120. Combined, the fiber delay, PD 108, and PM 111 serve as the OEFB loop. The SL 104 is biased between two and four times its threshold current of 20 mA, and the detuning frequency is controlled by adjusting the temperature of the SL 104.

With further reference to FIG. 1, the illustrative embodiment further includes a variable optical attenuator (VOA) 110 optically coupled to the ML 102, and the phase modulator (PM) 112 is optically coupled to the VOA 110. The circulator 114 is optically coupled to the VOA 110 and configured to inject the phase modulated optical signals into the SL 104 and to output optical signals into the one or more feedback paths 106₁, 106₂. The injection strength η can be controlled by the VOA 110. An optional laser 113 is optically coupled to paths 106₁ and 106₂.

Figure 2A:
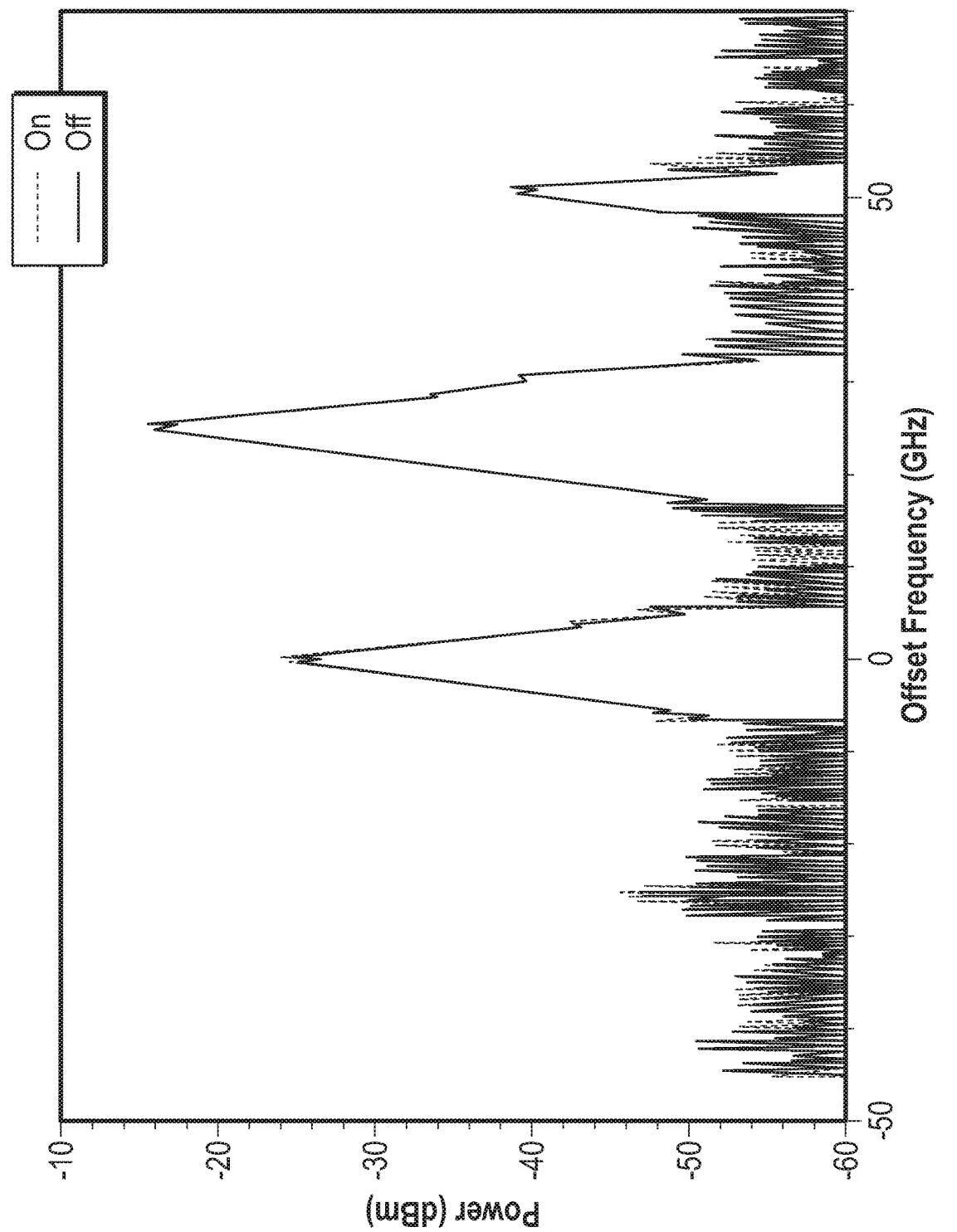
FIGS. 2A and 2B graphically represent the effects of optoelectronic feedback on the optical spectrum and microwave spectrum, respectfully.

Referring now to FIG. 2A the effects of OEFB on the optical spectrum are graphically represented as follows: (1) where OEFB is enabled and (2) OEFB disabled, and (FIG. 2B) the effects of OEFB on the microwave spectrum for (1) OEFB enabled and (2) OEFB disabled. The OSA 115 shows when the feedback is effectively turned ON and OFF. The frequency scale shown in FIG. 2A has been offset so that the regeneratively amplified signal ($f_{ML}$) from ML 102 is positively detuned near 25 GHz. It can be seen that because there is no amplification of the electronic signal in the feedback loop, the amplitude of the input signal to the PM 112 is approximately 40 dB less than the $V_\pi$ of the phase modulator. With reference to FIG. 2A, it can be observed that the OEFB does not drastically alter the dynamical state, except to increase $f_{SL}$, the shifted slave's signal (by ~0.87 dB).

When the optical emissions of the SL 104 are detected by the PD 108, the dominant microwave frequency is the difference between the two largest peaks in the optical spectrum, $f_{Dominant}=f_{ML}-f_{SL}$. This effect is depicted in microwave spectrum of FIG. 2B, which has been captured by the ESA 118.

Figure 2B:
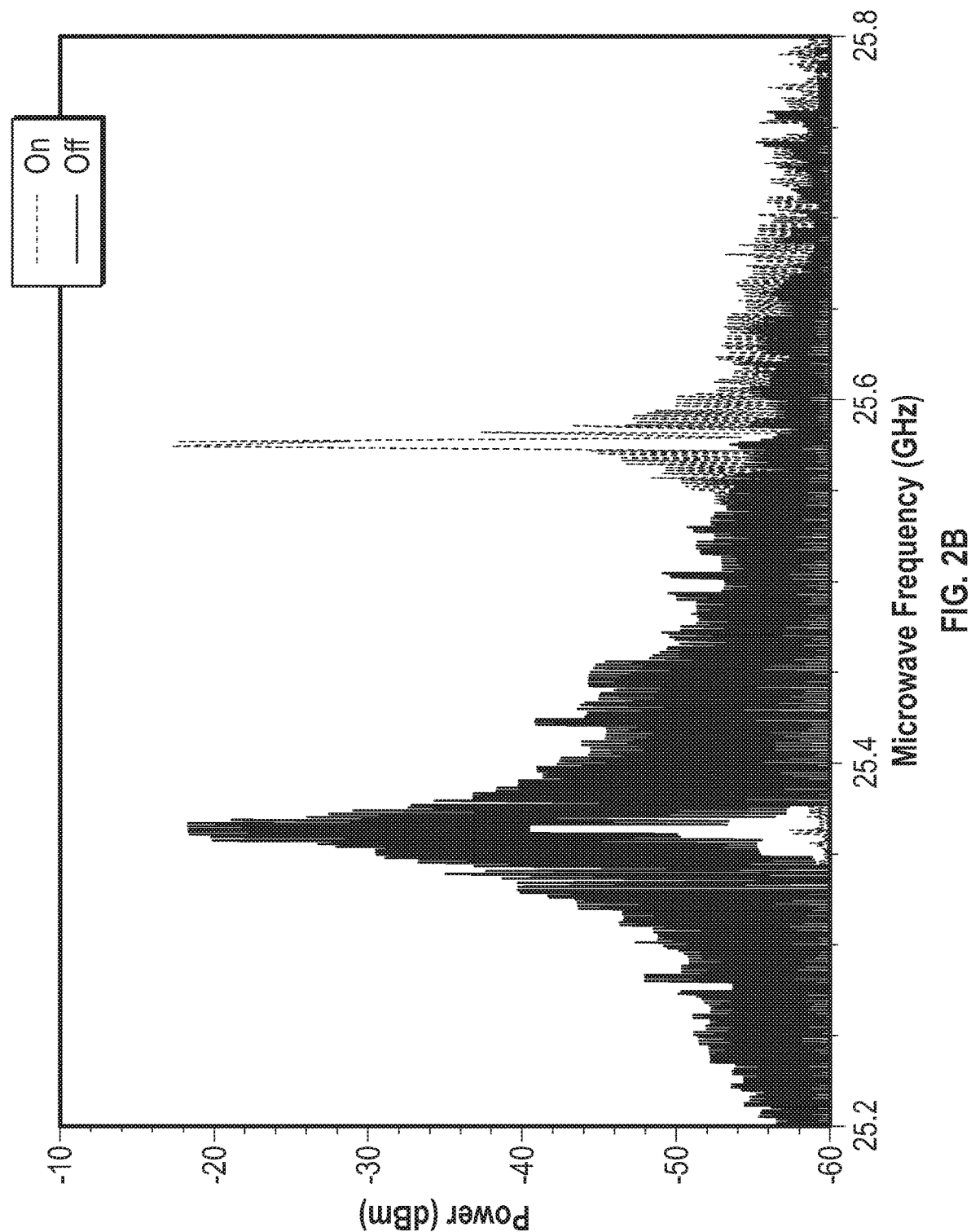

In FIG. 2B, a 600-MHz span contrasts the OEFB ON and OFF states; such a large window is needed because of the large linewidth and frequency drift associated with the microwave signal in the absence of OEFB (i.e., in the OFF state). In addition to the comparatively larger linewidth, the microwave signal experiences frequency drifts of several MHz over a 10-s time interval. In the presence of OEFB, the drift is minimized to <5 kHz over the same time interval.

Figure 2C:
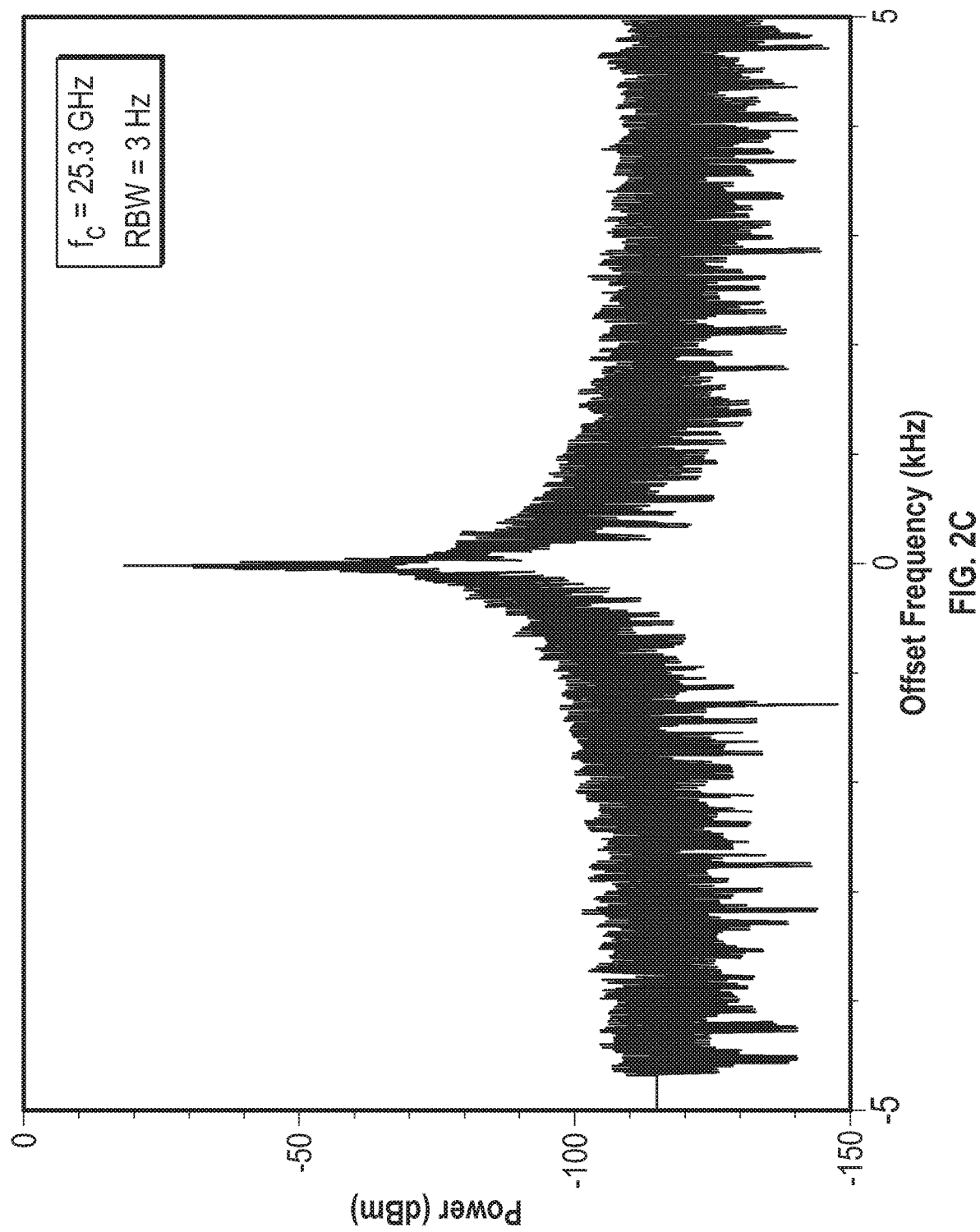
FIG. 2C is the microwave spectrum with a smaller span and narrower resolution bandwidth.

Referring now to FIG. 2C, a linewidth of <3 Hz may be observed as a consequence of the increased stability, only limited by the resolution of the ESA 114 for the sweep time required to cover the span of 10 kHz. The ML 102 and SL 104 have linewidths of approximately 10 kHz and 1 MHz, respectively, and the linewidth of the P1 frequency without feedback is typically on the order of 1 MHz or larger.

OEFB enables linewidth improvement. To observe these characteristics, the output of the SL 104 was heterodyned with an ultra-stable, narrow-linewidth (<1 Hz) laser (i.e., a Menlo Systems ORS 1500 available from Menlo Systems Inc., http://www.menlosystems.com). The measurements demonstrated that the redshifted free-running peak of the SL exhibits the phase and frequency noise characteristics of the ML 102, i.e., the peak $f_{SL}$ is coherent with $f_{ML}$. The P1 signal is spectrally filtered by the external cavity, and it will be understood that the parameter most influential on the phase noise of the microwave signal is the Q of the external feedback cavity. A shorter feedback cavity has been found to yield greater phase noise.

This is a similar process to the mechanism of optical sideband locking, where a phase modulator is driven by an external signal generator with a frequency nearly identical to the P1 frequency. For the case of sideband locking, a microwave signal's phase noise is derived from the signal generator, which explains why the linewidth was narrowed to <1 Hz in the presence of an external RF source. This can best be understood by recognizing that the phase modulator, when driven by the signal generator, imparts sidebands on the injected (optical) signal and the SL 104 locks to the sideband given that two constraints are met. The frequency of the drive signal must be close to the P1 frequency, and the amplitude of the drive signal must be large enough to lock the sideband to the redshifted slave.

The similarities of sideband locking to optoelectronic configurations in accordance with embodiments of the disclosure will be appreciated by those skilled in the art. For OEFB, the first constraint is automatically satisfied given that the drive signal is the P1 microwave signal. To understand the amplitude response of the P1 microwave signal, the microwave spectra may be examined such as depicted graphically in FIG. 3. Accounting for the gain (~20 dB) in the diagnostic branch leading to the ESA 118, it can be seen in FIG. 3 that the microwave power directed to the PM 112 is between −46 and −26 dBm. This is a significant reduction as compared to configurations that require 35-dB amplification of the microwave signal. This difference in the power required to lock the $f_{SL}$ peak is a function of selectively choosing the proper operating regime. The P1 state is operated near the Hopf bifurcation, which yields the maximum return in microwave power.

Figure 3:
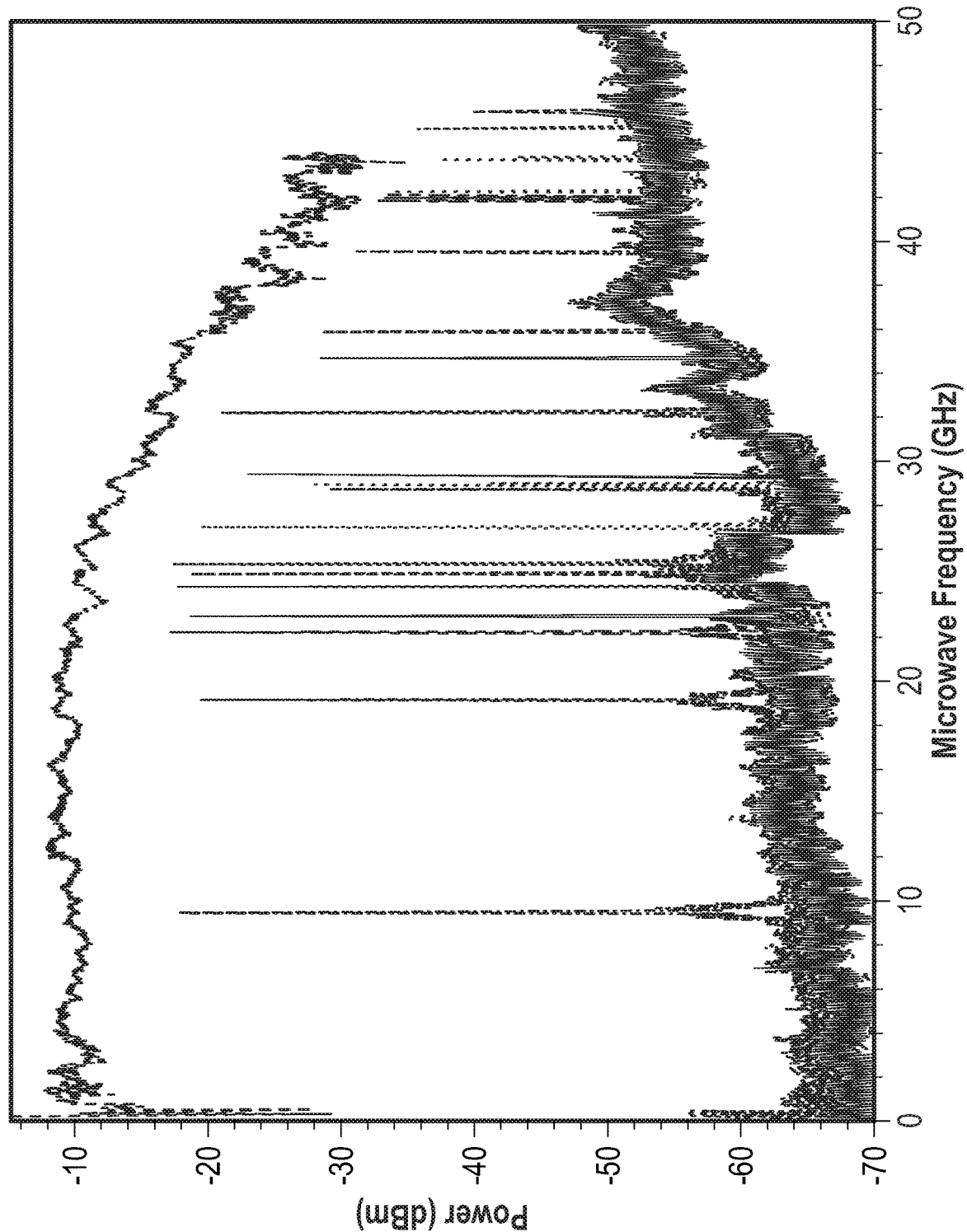
FIG. 3 graphically depicts microwave spectra at different bias points.

This drastic improvement in the phase noise is possible across a broad range of frequencies. FIG. 3 depicts several superimposed microwave spectra, spanning a range of frequencies from 10 to 46 GHz. To produce these microwave signals, the drive current to the SL 102 was fixed at 55 mA, and the detuning frequency and/or injection strength was changed between 0-45 GHz and −30-0 dB, respectively. The 10 GHz lower bound was the smallest frequency of the P1 state that still exhibited an amplitude large enough to undergo locking. This lower-frequency bound is directly related to the RO frequency of the SL 104. Thus, it is dependent on the laser parameters, including photon and carrier lifetimes, and operating parameters such as temperature and injection current, with the latter showing the well-known proportionality to the square root of the bias current above threshold (or optical power). The upper bound is related to the permissible frequencies which can be produced via optical injection and the gain found in the OEFB loop. The former is determined by the SL parameters, while the OEFB gain is more complicated in that it relies on the amplitude of the microwave signal, the response of the PD and phase modulator, and the phase-modulation-generated sideband amplitude needed to coherently lock the $f_{SL}$ frequency when operating in the microwave regime. The black curve (represented by the corresponding dashed line in the color key) in FIG. 3 depicts the overall response of the PM 120 and PD 108 combination. This shows a roll-off with a corner frequency, resulting in a 20-dB difference between frequencies below 20 and above 45 GHz, and highlights that the upper bound is limited by the bandwidth of the PM 120 and the PD 108, and is not limited by the technique. As illustrated in FIG. 3, the frequency span (50 GHz) and RBW (3 MHz) mask the linewidth narrowing. However, each of these signals exhibits a stability which permits measurements on different scales, e.g., see FIG. 2C for the 25.4-GHz signal.

Figure 4:
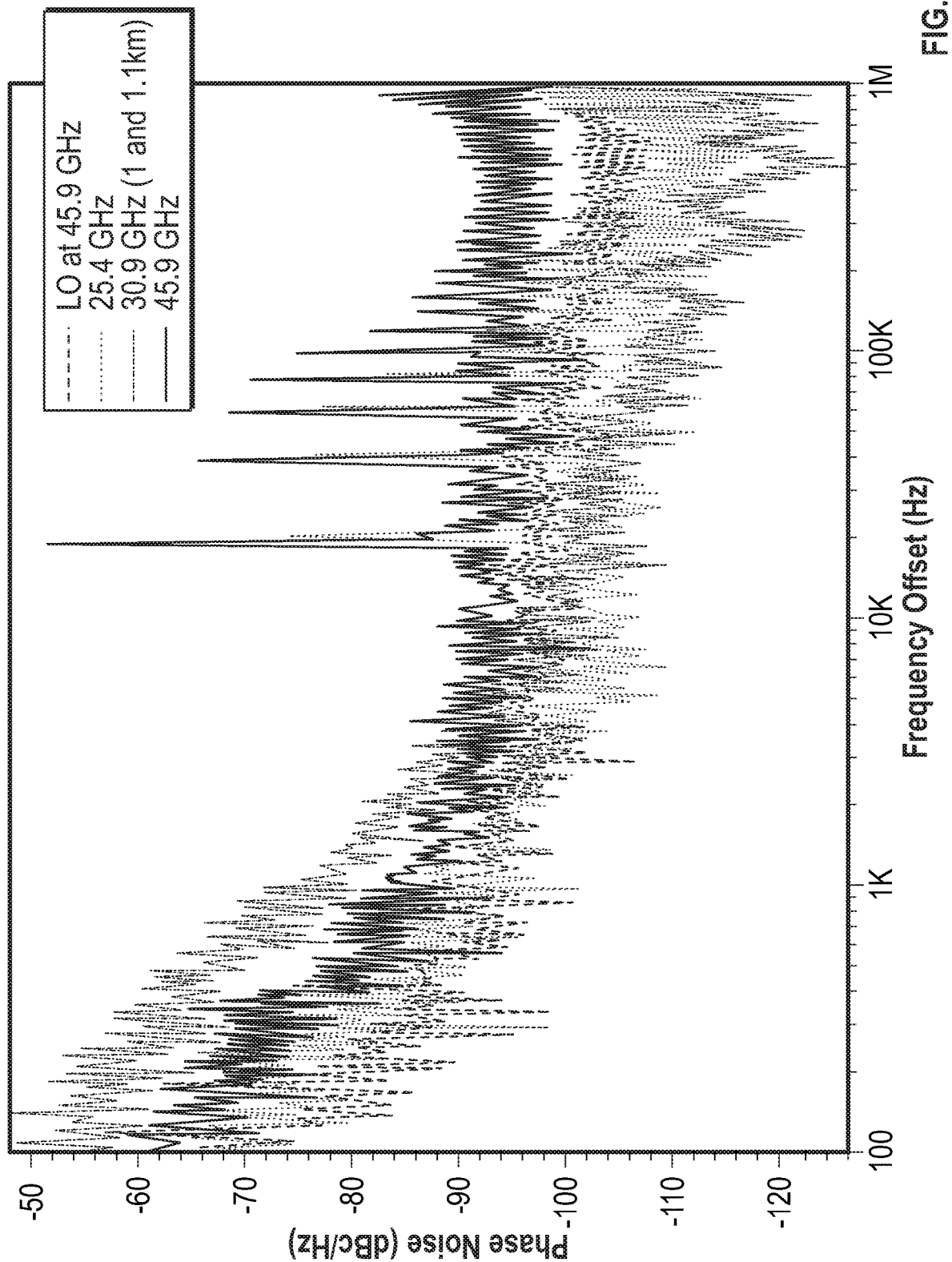
FIG. 4 is a graph that highlights phase-noise measurements at 25.4 and 45.9 GHz.

Referring now to FIG. 4, there is depicted a graphical representation highlighting phase-noise measurements at 25.4 and 45.9 GHz, which is representative of the trends over the range of operable frequencies in accordance with embodiments of the present disclosure. At a 10-kHz offset, the phase noise is −105 and −95 dBc/Hz, respectively. The peaks at ~20 kHz and its harmonics arise from the round-trip delay of the optoelectronic feedback, i.e., the next non-oscillating side-mode. To demonstrate that these peaks can be suppressed, the phase-noise spectrum generated at 30.9 GHz with the two delay paths in the feedback reduced to 1 and 1.1 km is shown. The comparison between the shorter (1 km) and longer (10 km) delay paths captures the general trade-off between reducing the phase noise close to the carrier and shifting the flattening (f0) of the phase noise closer to the carrier (when a longer delay is used). Notably, the $f^0$ slope in the phase noise is generated as consequence of the next non-oscillating side-mode and can be optimized (suppressed) by appropriately choosing the configuration and lengths of the delay paths. The signal at 45.9 GHz marks the largest frequency where the ESA phase-noise measurement as described above, was able to lock to the microwave signal. For purposes of comparison, the phase noise of a Keysight signal generator (E8652A), available from Keysight Technologies, www.keysight.com) outputting a signal at 45.9 GHz, is shown.

Figure 5A:
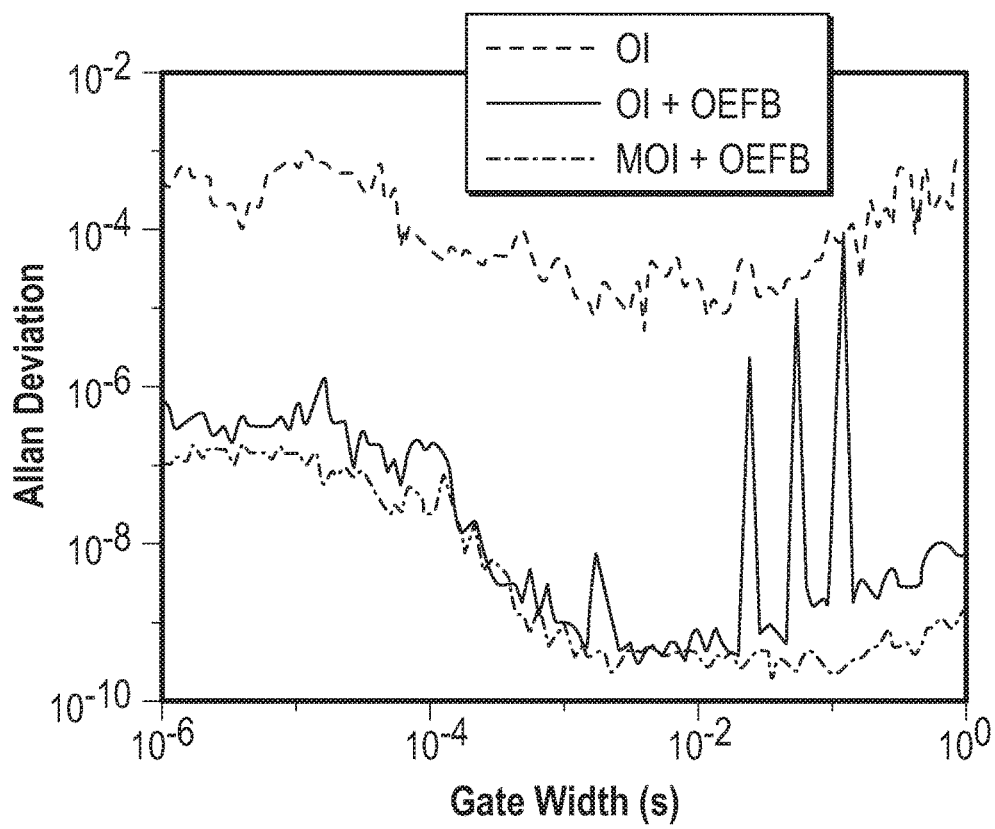
FIGS. 5A and 5B are depicted graphical representations of temporal stability measurements of a microwave signal at 21.6 GHz, showing the Allen Deviation (FIG. 5A) and frequency deviation (FIG. 5B).
Figure 5B:
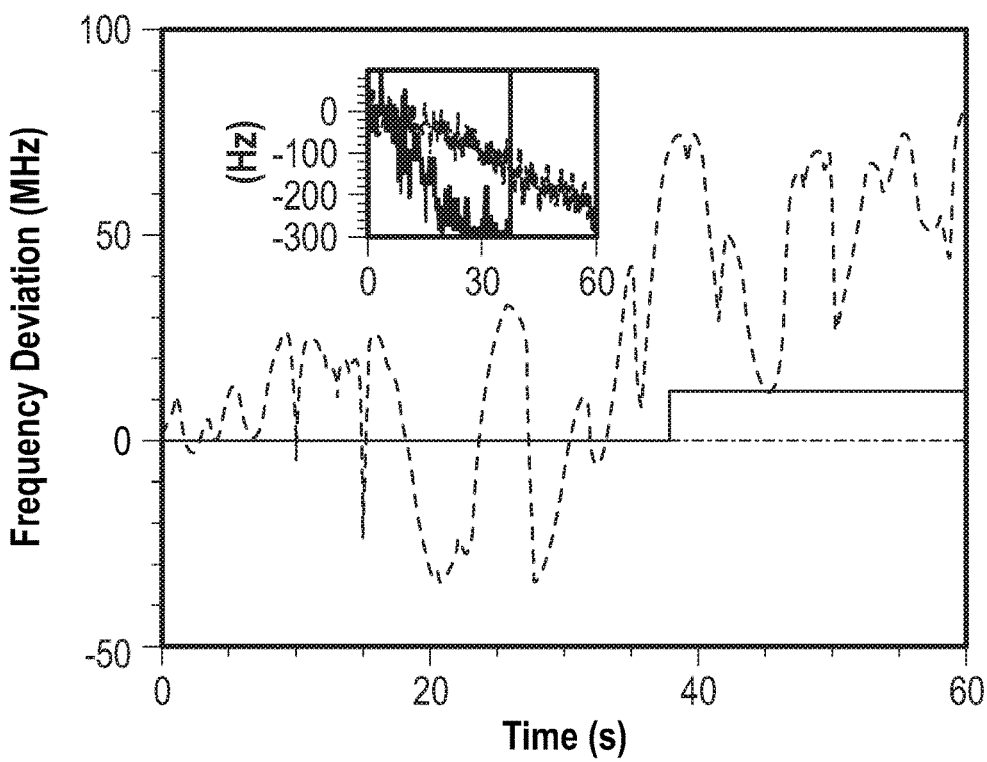

Referring now to FIGS. 5A and 5B, there are depicted graphical representations of temporal stability measurements of a P1 frequency at 21.6 GHz, including the Allen Deviation (FIG. 5A) and frequency deviation (FIG. 5B) for three different configurations: (1) optical injection (OI); (2) OI with optoelectronic feedback (OEFB); and (3) mutual optical injection (MOI) with OEFB. The Allen Deviation is calculated by averaging 10 instances for 100 equally and logarithmically spaced gate widths. In FIG. 5B, the frequency deviation of the microwave signal as a function of time is depicted. Of note is the different vertical scale depicted in the inset of the MOI+OEFB configuration. The frequency of the P1 signal produced solely by OI (blue curve in FIGS. 5A and 5B, exhibits approximately a 10,000-fold variance as compared to the OEFB cases. For a carrier frequency near 25 GHz, this is manifested by a difference between 100 Hz (MOI+OEFB) and 1 MHz (OI) variations near a 1-μs gate width. It will be appreciated that the P1 frequency deviations of the OI case is commensurate with the frequency deviations for the free-running SL 104. This is also captured by the temporal dynamics of the microwave signal depicted in FIG. 5B, which is recorded by the frequency counter after down-converting the microwave signal. With respect to the OEFB case, a mode hop can be observed in FIG. 5B that corresponds to a 10 MHz increase. Similar mode hops are displayed in FIG. 5B and these are shown by a sudden increase in the Allan Deviation.

Further improvements can be observed when the ML 102 is subject to OI from the SL 104. The reason for such improvements is related to the free-running ML 102, which undergoes external cavity mode hops that arise due to parasitic reflections from FC-APC fiber connectors. Mutual injection reduces the frequency of the mode hops. The MOI also introduces another time delay into the system, corresponding to $T_{MOI}$=d/c≈15 ns, where d≈3 m, the distance of the optical path between the ML 102 and SL 104. This additional timescale further suppresses the side-modes as observed in the phase-noise measurements depicted in FIG. 4, which reduces the likelihood of a mode hop to one of these external cavity modes.

It will be appreciated that the devices, systems, and methods disclosed in accordance with embodiments of the disclosure are set forth by way of example and not of limitation. Absent an explicit indication to the contrary, the disclosed devices, systems, and method steps may be modified, supplemented, omitted, and/or re-ordered without departing from the scope of this disclosure. Numerous variations, additions, omissions, and other modifications will be apparent to one of ordinary skill in the art. In addition, the order or presentation of method steps in the description and drawings above is not intended to require this order of performing the recited steps unless a particular order is expressly required or otherwise clear from the context.

It will be understood by those skilled in the art that various changes may be made in the form and details of the described embodiments resulting in equivalent embodiments that remain within the scope of the appended claims.

What is claimed is:

1. A system for generating optically synthesized microwave signals with broadband tunability, the system comprising:
   a first laser;
   a second laser optically coupled to the first laser, the second laser configured to receive optical signals injected by the first laser, the second laser operable to output optical signals via one or more feedback paths;
   a photodetector optically coupled to the second laser over the one or more feedback paths, the photodetector operable to convert optical signals to electrical signals; and a phase modulator coupled to the photodetector, the electrical signals from the photodetector operable to drive the phase modulator and close the one or more feedback paths, whereby, the system is operable to output at least one of electrical signals and optical signals, and wherein the one or more feedback paths comprise a first feedback path and a second feedback path, the first path having a first corresponding length and the second path having a second corresponding length, where a frequency spacing of the feedback paths is significantly smaller than a frequency of microwave signals.

2. The system of claim 1, further comprising one or more polarization controllers to orthogonally polarize optical fields for corresponding optical signals in the first and second paths.

3. The system of claim 1, where the photodetector is one of a photodiode and balanced photodiode.

4. The system of claim 3, where the photodetector combines optical signals received over a plurality of feedback paths.

5. The system of claim 1, where the first laser is a master laser, and the second laser is a slave laser.

6. The system of claim 1, where the first laser and the second laser are mutually coupled.

7. The system of claim 1, further comprising:
a variable optical attenuator optically coupled to the first laser, where the phase modulator is optically coupled to the variable optical attenuator; and
a circulator optically coupled to the variable optical attenuator and configured to inject phase modulated optical signals into the second laser and to output optical signals into the one or more feedback paths.

8. The system of claim 7, further comprising a mutual optical injection path coupled to the variable optical attenuator.

9. The system of claim 1, where the lasers are distributed feedback lasers.

10. The system of claim 1, further comprising at least one polarizing beam splitter.

11. The system of claim 1, where the second laser is biased at multiples of a threshold current.

12. The system of claim 11, where a detuning frequency is controlled by adjusting a temperature of the slave laser.

13. The system of claim 1, where an injection strength is controlled by a variable optical attenuator.

14. The system of claim 1, where the electrical signals are microwave signals.

15. A method for generating optically synthesized microwave signals with broadband tunability, the method comprising:
generating light by a first laser;
receiving light at a second laser optically coupled to the first laser and configured to receive optical signals injected from the first laser, the second laser operable to output optical signals via one or more feedback paths;
converting optical signals to electrical signals by a photodetector optically coupled to the second laser over the one or more feedback paths; and
driving a phase modulator coupled to the photodetector with electrical signals from the photodetector to close the one or more feedback paths,
wherein the one or more feedback paths comprise a first feedback path and a second feedback path, the first path having a first corresponding length and the second path having a second corresponding length, where a frequency spacing of the feedback paths is significantly smaller than a frequency of microwave signals.

16. The method of claim 15, further comprising orthogonally polarizing optical fields for corresponding optical signals in the first and second paths.

17. The method of claim 15, further comprising combining, by the photodetector, optical signals received over a plurality of feedback paths.

18. The method of claim 15, where the first laser is a master laser, and the second laser is a slave laser.

19. The method of claim 15, where the first laser and the second laser are mutually coupled.

20. The method of claim 15, further comprising injecting phase modulated optical signals into the second laser, and outputting optical signals by the second laser into the one or more feedback paths.

21. The method of claim 15, further comprising a mutual optical injection path coupled to a variable optical attenuator.

22. The method of claim 15 where a detuning frequency is controlled by adjusting a temperature of the second laser.

23. The method of claim 15, where an injection strength is controlled by a variable optical attenuator.

* * * * *